United States Patent
Uedaira

(10) Patent No.: US 10,215,623 B2
(45) Date of Patent: Feb. 26, 2019

(54) OPTICAL SENSOR AND METHOD OF CORRECTING SAME

(71) Applicant: Rohm Co., Ltd., Kyoto (JP)

(72) Inventor: Yoshitsugu Uedaira, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/632,499

(22) Filed: Jun. 26, 2017

(65) Prior Publication Data

US 2018/0003556 A1 Jan. 4, 2018

(30) Foreign Application Priority Data

Jul. 1, 2016 (JP) .................. 2016-131546

(51) Int. Cl.
*H01J 40/14* (2006.01)
*G01J 1/04* (2006.01)
*G01J 1/16* (2006.01)
*G01J 1/42* (2006.01)

(52) U.S. Cl.
CPC ........... *G01J 1/0488* (2013.01); *G01J 1/1626* (2013.01); *G01J 1/4228* (2013.01); *G01J 2001/4233* (2013.01)

(58) Field of Classification Search
CPC ...... G01J 1/0488; G01J 1/0492; G01J 1/4228; G01J 1/1626; G01J 2001/4223
USPC .......................... 250/214 R, 214 DC, 214 SW
See application file for complete search history.

(56) References Cited

U.S. PATENT DOCUMENTS

| 8,274,051 B1 * | 9/2012 | Aswell ............... G01J 3/513 250/338.4 |
| 9,568,361 B2 * | 2/2017 | Nakata ............... G01J 1/1626 |
| 2016/0169734 A1 | 6/2016 | Uedaira et al. | |

FOREIGN PATENT DOCUMENTS

| JP | 2011-106875 | 6/2011 |
| JP | 2016-115746 | 6/2016 |

* cited by examiner

*Primary Examiner* — Kevin Pyo
(74) *Attorney, Agent, or Firm* — Fish & Richardson P.C.

(57) ABSTRACT

An optical sensor (10) includes a first switch (SW1) and a second switch (SW2), these switches are switched between a first step and a second step and thus the coupling of light receiving portions (photodiodes) and three analog-to-digital converters (ADCs) is switched. In the first step of the switch, photocurrents generated in a blue light receiving portion (BLUE), a green light receiving portion (GREEN) and a red light receiving portion (RED) are processed in real time. In the second step, photocurrents generated in an infrared light receiving portion (Ir), an environmental light receiving portion (CLEAR) and the green light receiving portion (GREEN) are processed. The photocurrents of the infrared light receiving portion (Ir) and the environmental light receiving portion (CLEAR) generated in the first step are calculated from a ratio of the two photocurrents measured in the green light receiving portion (GREEN).

18 Claims, 8 Drawing Sheets

|  | FIRST MEASUREMENT SW1, SW2 →CONTACT POINT a | SECOND MEASUREMENT SW1, SW2 →CONTACT POINT b |
|---|---|---|
| Ir | * $E_{ir1} = \dfrac{E_{g1}}{E_{g2}} \cdot E_{ir2}$ | $E_{ir2}$ |
| BLUE | $E_{b1}$ | |
| GREEN | $E_{g1}$ | $E_{g2}$ |
| RED | $E_{r1}$ | |
| CLEAR | * $E_{c1} = \dfrac{E_{g1}}{E_{g2}} \cdot E_{c2}$ | $E_{c2}$ |

*ESTIMATION VALUE (CORRECTION VALUE)

FIG.7

| | FIRST MEASUREMENT SW1, SW2 →CONTACT POINT a | SECOND MEASUREMENT SW1, SW2 →CONTACT POINT b |
|---|---|---|
| Ir | $* E_{ir1} = \dfrac{E_{g1}}{E_{g2}} \cdot E_{ir2}$ | $E_{ir2}$ |
| BLUE | $E_{b1}$ | |
| GREEN | $E_{g1}$ | $E_{g2}$ |
| RED | $E_{r1}$ | |
| CLEAR | $* E_{c1} = \dfrac{E_{g1}}{E_{g2}} \cdot E_{c2}$ | $E_{c2}$ |

*ESTIMATION VALUE (CORRECTION VALUE)

OPTICAL SENSOR AND METHOD OF CORRECTING SAME

CROSS-REFERENCE TO RELATED APPLICATIONS

This application is based on Japanese Patent Application No. 2016-131546 filed on Jul. 1, 2016, the contents of which are hereby incorporated by reference.

BACKGROUND OF THE INVENTION

1. Field of the Invention

The present invention relates to an optical sensor which includes a switch circuit and a method of correcting such an optical sensor.

2. Description of Related Art

In recent years, optical sensors have been widely adopted in various types of electronic devices such as a smart phone, a digital still camera, a navigation system and a tablet terminal.

FIG. 8 shows an optical sensor which is prepared for detecting, for example, five types of light. The optical sensor 1 includes an infrared light receiving portion Ir, a blue light receiving portion BLUE, a green light receiving portion GREEN, a red light receiving portion RED and an environmental light receiving portion CLEAR. The blue light receiving portion BLUE, the green light receiving portion GREEN and the red light receiving portion RED are covered with an infrared light cut filter 2. A photodiode 3I, a photodiode 3B, a photodiode 3G, a photodiode 3R and a photodiode 3C are prepared for the infrared light receiving portion Ir, the blue light receiving portion BLUE, the green light receiving portion GREEN, the red light receiving portion RED and the environmental light receiving portion CLEAR, respectively. Furthermore, analog-to-digital converters (hereinafter, ADCs) are coupled to the light receiving portions. Specifically, the ADC 4I, the ADC 4B, the ADC 4G, the ADC 4R and the ADC 4C are prepared. Furthermore, the outputs of the ADCs are connected to the input side of a logic circuit 5. The outputs of the logic circuit 5 are connected to external terminals SDA, SCL, INT and ADDR, respectively. The external terminals are connected to a CPU 6. Furthermore, in the optical sensor 1, an oscillator OSC and a power-on reset POR are incorporated. Moreover, in the optical sensor 1, external terminals such as a power supply terminal VCC and a ground terminal GND are included.

As another form of the optical sensor shown in FIG. 8, for example, an optical sensor disclosed in patent document 1 (Japanese Unexamined Patent Application Publication No. 2011-106875) is known. In patent document 1, a small-sized, low-cost and highly accurate optical sensor is realized. It is considered that in order to achieve such an objective, a switch circuit which selects a photocurrent and one ADC which converts the selected photocurrent into a digital signal are included.

As yet another form of the optical sensor, an optical sensor is disclosed in patent document 2 (Japanese Unexamined Patent Application Publication No. 2016-115746). Patent document 2 is proposed by the present inventor. In patent document 2, a red light receiving portion, a green light receiving portion and a blue light receiving portion, an infrared light cut filter which covers these light receiving portions and a computation portion are included. Furthermore, patent document 2 discloses a layout diagram of a light reception region in an optical detection device.

In the optical sensor shown in FIG. 8, the ADCs are indiviudally prepared for the five light receiving portions, and thus it is possible to measure, in real time, for example, the illuminations, the color temperatures and the like of the five colors. In this way, it is possible to advantageously realize a highly accurate optical sensor. Disadvantageously, however, the five ADCs need to be prepared, and thus the chip area is increased, with the result that the cost is increased.

In patent document 1, the configuration is achieved with the one ADC, and thus it is possible to expect the realization of a small-sized and low-cost optical sensor. However, for example, it is necessary to measure, in separate steps (timings), photocurrents generated in the five types of light receiving portions, with the result that it is impossible to expect the realization of a highly accurate optical sensor. Although patent document 2 discloses that the ADCs are respectively prepared for the three light receiving portions of the red light receiving portion, the green light receiving portion and the blue light receiving portion, it does not disclose a configuration of four or more light receiving portions and ADCs connected thereto.

SUMMARY OF THE INVENTION

An object of the present invention is to provide a highly accurate optical sensor which can reduce the size of a semiconductor integration circuit (LSI) so as to reduce the cost and the power consumption thereof and which can enhance the accuracy of detection of a photocurrent.

A "RGB light receiving portion" used in the present specification is a generic name for light receiving portions of three colors of red (R), green (G) and blue (B). The "other light receiving portion" is a generic name for the light receiving portions of colors other than the RGB light receiving portion. A "computation reference light receiving portion" is at least one of the "RGB light receiving portion" and the "other light receiving portion", and indicates a light receiving portion which is adopted for estimating and correcting the values of an irradiance, an illumination, a color temperature, a chromaticity and the like in the "computation reference light receiving portion".

The optical sensor of the present invention includes a plurality of light receiving portions which include: a RGB light receiving portion formed with a green light receiving portion, a red light receiving portion and a blue light receiving portion; and the other light receiving portion having a spectral sensitivity characteristic different from the spectral sensitivity characteristic of the RGB light receiving portion. The optical sensor of the present invention further includes: a plurality of analog-to-digital converters (ADCs) which convert photocurrents generated in the light receiving portions into digital values; and a switch which is coupled to a signal path between the light receiving portions and the analog-to-digital converters. The switch switches between a first step of applying the photocurrents generated in the RGB light receiving portion to the analog-to-digital converters and a second step of applying the photocurrent generated in a computation reference light receiving portion and the photocurrent generated in the other light receiving portion to the analog-to-digital converters. The switching of the switches described above is performed in order to calculate the value of the photocurrent generated in the other light receiving portion in the first step from a ratio between the photocurrents of the computation reference light receiving portion detected in the first step and the second step.

Other features, elements, steps, advantages and characteristics in the present invention will become more obvious from the detailed description of preferred embodiments and accompanying drawings related thereto below.

BRIEF DESCRIPTION OF THE DRAWINGS

FIG. 7 is a diagram illustrating a method of correcting the optical sensor of the present invention.

DETAILED DESCRIPTION OF THE PREFERRED EMBODIMENTS

Embodiment of the Present Invention

Figure 1:
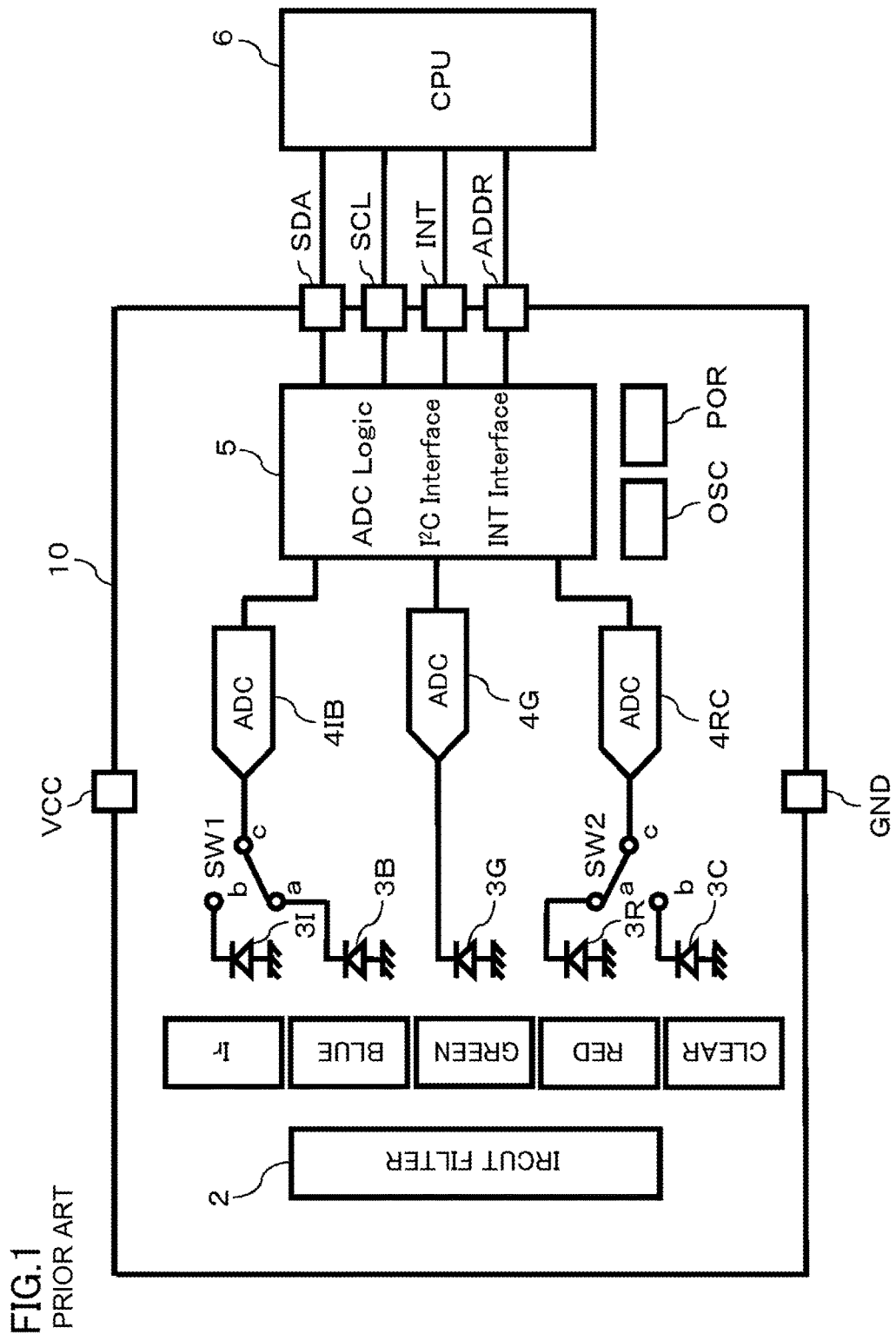
FIG. 1 is a circuit block diagram showing the configuration of an optical sensor according to an embodiment of the present invention.
Figure 8:
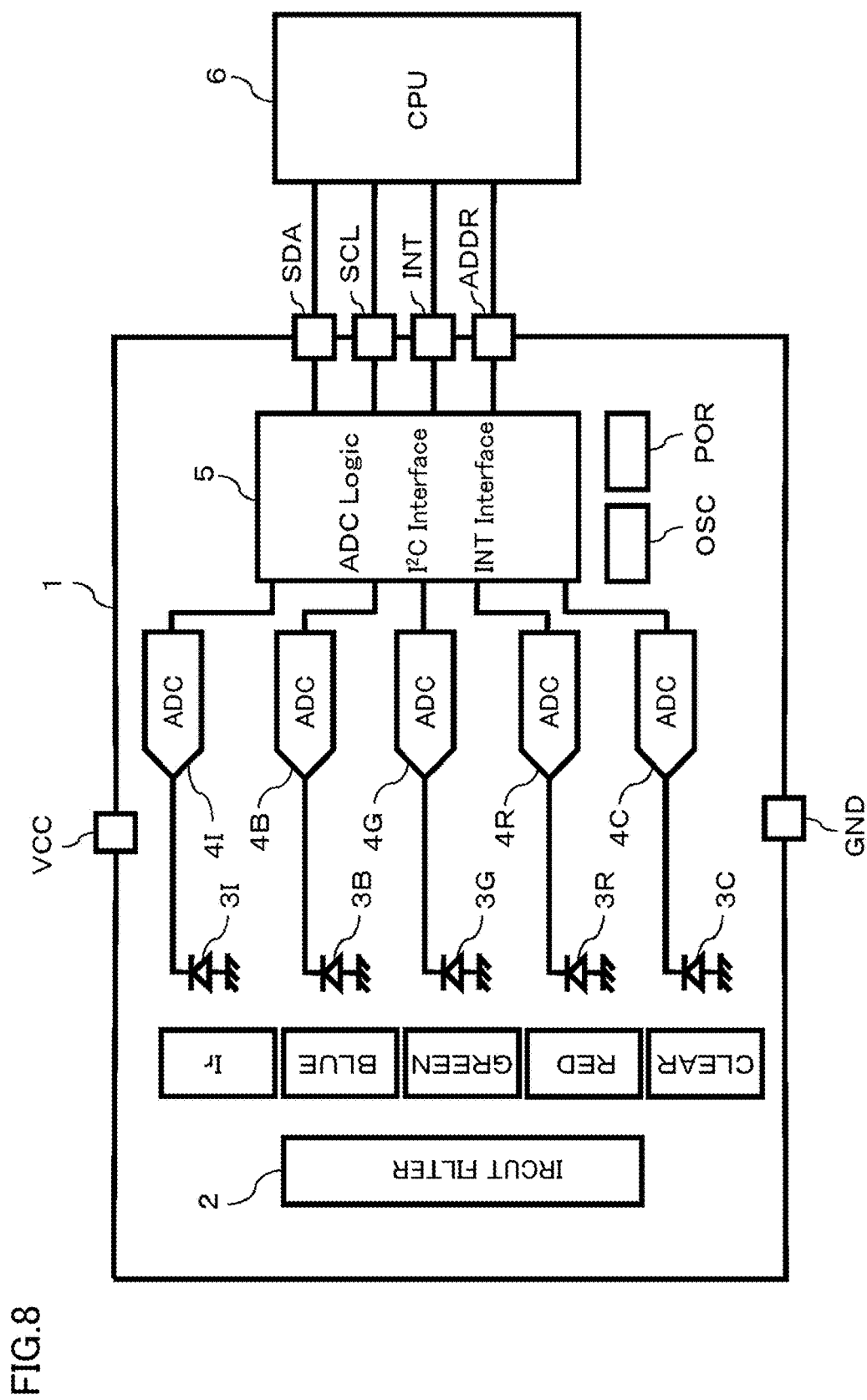
FIG. 8 is a circuit block diagram showing the configuration of an optical sensor which is an embodiment of a conventional technology.

FIG. 1 is a circuit block diagram showing the configuration of an optical sensor 10 according to an embodiment of the present invention. Although the optical sensor 10 includes substantially the same circuit portions and circuit functional portions as the conventional optical sensor 1 shown in FIG. 8, the optical sensor 10 significantly differs in the following points. Firstly, the optical sensor 10 includes switches SW1 and SW2. Secondly, the number of ADCs is three in its configuration.

The optical sensor 10 includes an infrared light receiving portion Ir, a blue light receiving portion BLUE, a green light receiving portion GREEN, a red light receiving portion RED and an environmental light receiving portion CLEAR. The optical sensor 10 is built into a semiconductor substrate, and is finally mounted on a package with, for example, 8 pins of external terminals.

The blue light receiving portion BLUE, the green light receiving portion GREEN and the red light receiving portion RED are covered with an infrared light cut filter 2 so that unnecessary infrared light is cut.

For ease of drawing and description, the individual light receiving portions are shown as if each light receiving portion is formed with only a photodiode and its cathode side is connected to the input side of the ADC. Specifically, the infrared light receiving portion Ir corresponds to a photodiode 3I, the blue light receiving portion BLUE corresponds to a photodiode 3B, the green light receiving portion GREEN corresponds to a photodiode 3G, the red light receiving portion RED corresponds to a photodiode 3R and the environmental light receiving portion CLEAR corresponds to a photodiode 3C. Each light receiving portion is not actually formed with only one photodiode but includes a plurality of photodiodes and a plurality of color filters.

In order to convert a photocurrent which is an analog signal generated in each light receiving portion into a digital value, the ADC is prepared. Specifically, three ADCs of an ADC 4IB, an ADC 4G and an ADC 4RC are prepared. For ADCs, types such as an integral type, a successive comparison type and a parallel comparison type are present, and in the present invention, for example, the integral type is adopted.

Furthermore, the switches SW1 and SW2 are coupled to signal paths between the photodiodes and the ADCs. The switching of the switches SW1 and SW2 is performed with an unillustrated switching signal supplied from a logic circuit 5. A contact point a of the switch SW1 is connected to the cathode side of the photodiode 3B (blue), a contact point b is connected to the cathode side of the photodiode 3I and a midpoint c is connected to the input side of the ADC 4IB.

When the midpoint c and the contact point a in the switch SW1 are connected togehter, the photocurrent of the photodiode 3B, that is, the blue light receiving portion BLUE is converted into a digital value in the ADC 4IB. When the midpoint c and the contact point b are connected together, the photocurrent of the photodiode 3I, that is, the infrared light receiving portion Ir is converted into a digital value in the ADC 4IB.

A contact point a of the switch SW2 is connected to the cathode side of the photodiode 3R (red), a contact point b is connected to the cathode side of the photodiode 3C and a midpoint c is connected to the input side of the ADC 4RC.

When the midpoint c and the contact point a in the switch SW2 are connected together, the photocurrent of the photodiode 3R, that is, the red light receiving portion RED is converted into a digital value in the ADC 4RC. When the midpoint c and the contact point b in the switch SW2 are connected together, the photocurrent of the photodiode 3C, that is, the environmental light receiving portion CLEAR is converted into a digital value in the ADC 4RC.

The photodiode 3G of the green light receiving portion GREEN is directly coupled to the input of the ADC 4G. Hence, the photocurrent generated in the green light receiving portion GREEN is constantly applied to the ADC 4G regardless of the switching state of the switches SW1 and SW2. In the present embodiment, the green light receiving portion GREEN is regarded as a computation reference light receiving portion.

The outputs of the ADC 4IB, the ADC 4G and the ADC 4RC are individually supplied to the logic circuit 5. In the logic circuit 5, for example, a register, a computation circuit and the like are incorporated, and an irradiance, an illumination, a color temperature and the like which correspond to the photocurrents generated in the photodiodes are stored or computation values determined by computations are stored.

In the logic circuit 5, a circuit function (ADC Logic) which stores or computes various types of optical data and information processed in the ADCs, a circuit function ($I^2C$ Interface) for exchanging the data and information in the circuit portion with the CPU 6 and an interrupt circuit function (INT Interface) are incorporated. The interrupt function is prepared for notifying a variation in the irradiance to the CPU 6.

The outputs of the logic circuit 5 are connected to external terminals SDA, SCL, INT and ADDR, respectively. The external terminals are connected to the CPU 6. The external terminals SDA and SCL are prepared as the $I^2C$ Interface, the external terminal INT is prepared as the interrupt function and the external terminal ADDR is prepared as a terminal for inputting the slave address of the $I^2C$ Interface. When a preset illumination range is exceeded, for example, a low level (L) is output to the external terminal INT.

Furthermore, as external terminals, a power supply terminal VCC and a ground terminal GND are prepared. In the optical sensor 10, for example, an unillustrated test terminal for testing the optical sensor 10 may be provided. In the optical sensor 10, an oscillator OSC and a power-on reset POR are incorporated.

The external terminals SDA, SCL, INT and ADDR are connected to the CPU 6. Through these external terminals, various types of signals are exchanged between the logic circuit 5 and the CPU 6.

The first feature of the present invention is, as understood from the circuit block diagram of FIG. 1, that the two light receiving portions, that is, the photodiodes are switched with the switches SW1 and SW2. The second feature is that when both the switches SW1 and SW2 are connected to the contact point a, the blue light receiving portion BLUE (the photodiode 3B) and the red light receiving portion RED (the photodiode 3R) are selected, and that furthermore, the three colors including the green light receiving portion GREEN (the photodiode 3G) without the intervention of the switches are respectively subjected to signal processing in the ADCs 4IB, 4RC and 4G in real time. Furthermore, when both the switches SW1 and SW2 are switched to the contact point b, the three colors of the infrared light receiving portion Ir (the photodiode 3I), the environmental light receiving portion CLEAR (the photodiode 3C) and the green light receiving portion GREEN (the photodiode 3G) are respectively subjected to signal processing in the ADCs 4IB, 4RC and 4G in real time. Hence, the signal processing is performed twice on the green light receiving portion GREEN (the photodiode 3G).

The signal processing is performed twice on the green light receiving portion GREEN so that the values of the irradiance, the illumination, the color temperature and the like in the infrared light receiving portion Ir and the environmental light receiving portion CLEAR when in the switches SW1 and SW2, the contact point a is selected are corrected from the values of the two measurements. In this way, the three ADCs are prepared, furthermore the switches are switched twice and thus it is possible to measure and estimate the illuminations and the color temperatures of the light receiving portions of the five colors.

Although in FIG. 1, the irradiances, the illuminations, the color temperatures and the like in the light of the RGB light receiving portion and the light of the two colors of the environmental light receiving portion CLEAR and the infrared light receiving portion Ir which are the other light receiving portion are measured, calculated and corrected, any one of the environmental light receiving portion CLEAR and the infrared light receiving portion Ir can also be selected and measured.

Although in the embodiment shown in FIG. 1, the green light receiving portion GREEN is constantly coupled to the ADC 4G so that the green light receiving portion GREEN (the photodiode 3G) is set as the computation reference light receiving portion, the red light receiving portion RED (the photodiode 3R) may be set as the computation reference light receiving portion. As the computation reference light receiving portion, the RGB light receiving portion or the other light receiving portion such as the environmental light (CLEAR) or the infrared light (Ir) may be selected. However, the green light receiving portion GREEN (the photodiode 3G) is preferably selected. This is because the wavelength of green light falls within a range of a relative luminosity which feels most strongly in human eyes. Moreover, since the wavelength is present substantially in the middle of the wavelengths of visible light, it is far from the wavelengths of ultraviolet light and infrared light, with the result that it is relatively easy to remove the effects of these types of light. Naturally, as the computation reference light receiving portion, a plurality of light receiving portions such as the green light receiving portion GREEN (the photodiode 3G) and the red light receiving portion RED (the photodiode 3R) can also be set.

In the embodiment of the present invention shown in FIG. 1, the photocurrents of the five light receiving portions including the RGB light receiving portion are detected. However, the present invention can also be applied to an optical sensor (=an optical sensor including only the other light receiving portion) which does not include the RGB light receiving portion at all.

Figure 2:
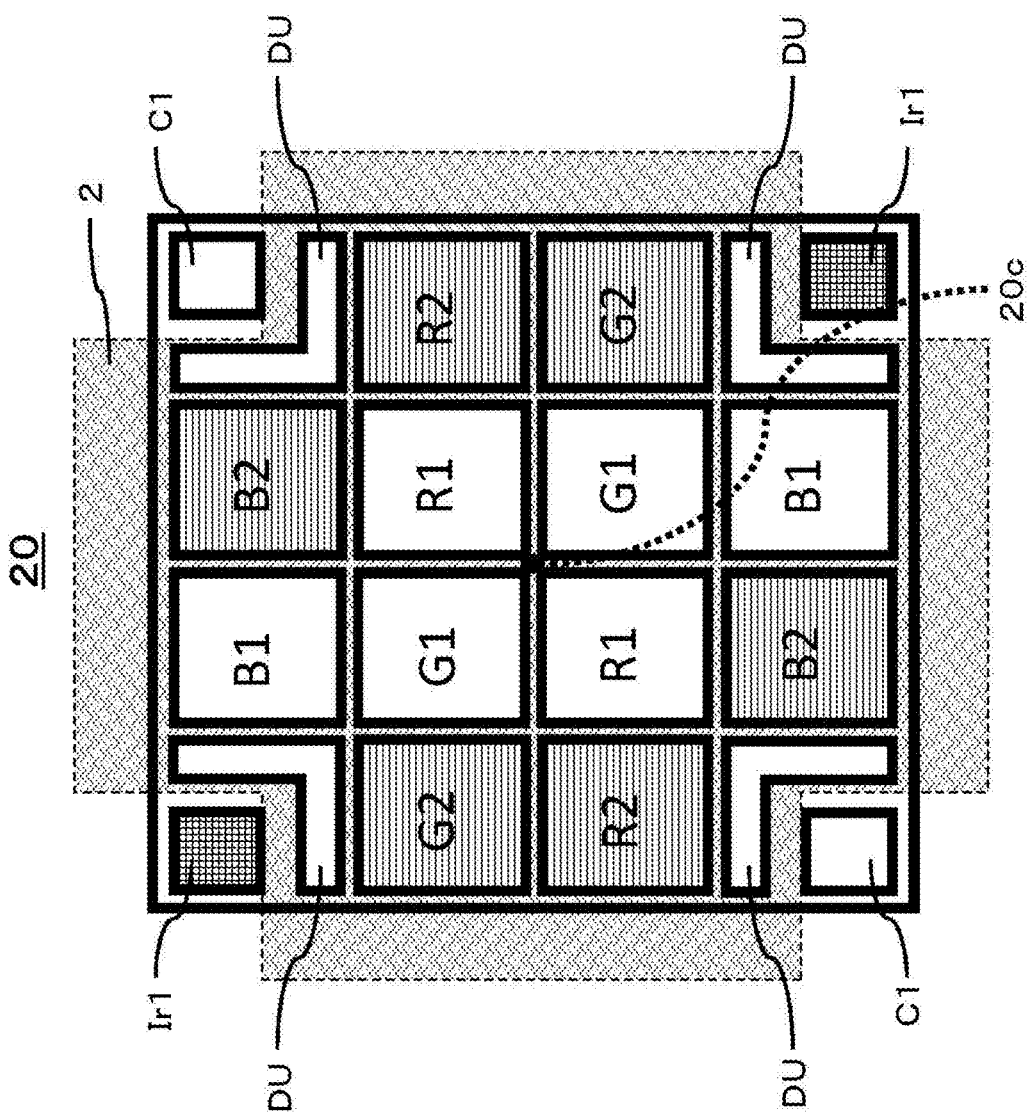
FIG. 2 is a layout diagram of a light reception region used in the optical sensor of the present invention.

FIG. 2 shows a light reception region 20. The light reception region 20 is a plan view showing the arrangement of the infrared light receiving portion Ir, the blue light receiving portion BLUE, the green light receiving portion GREEN, the red light receiving portion RED, the environmental light receiving portion CLEAR and the infrared light cut filter 2 shown in FIG. 1.

The light reception region 20 is formed in the shape of, for example, a quadrangle in plan view, and its center is indicated by a symbol 20c. In the vicinity of the center 20c of the light reception region 20, a light receiving portion G1 is arranged, and a light receiving portion G2 is arranged next to the light receiving portion G1 slightly away from the center 20c. The light receiving portions G1 and G2 together form the green light receiving portion GREEN shown in FIG. 1.

Although in FIG. 2, a difference in structure between the light receiving portions G1 and G2 cannot be recognized, the light receiving portion G1 includes a green color filter which transmits green light, and in the light receiving portion G2, a separate color filter is formed so as to be overlaid on the green color filter. Although the separate color filter interrupts light in a wavelength range which passes through the light receiving portion G1, the separate color filter transmits light in part of a wavelength range other than the wavelength range, and particularly transmits light in the entire wavelength range of the infrared light (Ir). The light receiving portions G1 and G2 which have the difference in structure have different spectral sensitivity characteristics, the different spectral sensitivity characteristics are subjected to computation processing in the logic circuit 5 and thus the sensitivity of light in a wavelength range other than the green included in the light receiving portion G1 is suppressed, with the result that it is possible to extract the green faithfully.

As with the light receiving portion G1, a light receiving portion R1 is arranged in the vicinity of the center 20c of the light reception region 20, and a light receiving portion R2 is arranged next to the light receiving portion R1 slightly away from the center 20c. The light receiving portions R1 and R2 together form the red light receiving portion RED shown in FIG. 1.

The light receiving portion R1 includes a red color filter which transmits red light, and in the light receiving portion R2, a separate color filter is formed so as to be overlaid on the red color filter. Although the separate color filter interrupts light in a wavelength range which passes through the light receiving portion R1, the separate color filter transmits light in part of a wavelength range other than the wavelength range, and particularly transmits light in the entire wavelength range of the infrared light (Ir). The light receiving portions R1 and R2 which have the difference in structure have different spectral sensitivity characteristics, the different spectral sensitivity characteristics are subjected to computation processing in the logic circuit 5 and thus the sensitivity of light in a wavelength range other than the red included in the light receiving portion R1 is suppressed, with the result that it is possible to extract the red faithfully.

Light receiving portions B1 and B2 slightly differ from the light receiving portions G1 and R1, and are arranged slightly away from the center 20c. The light receiving portions B1 and B2 together form the blue light receiving portion BLUE shown in FIG. 1.

The light receiving portion B1 includes a blue color filter which transmits blue light, and in the light receiving portion B2, a separate color filter is formed so as to be overlaid on the blue color filter. Although the separate color filter interrupts light in a wavelength range which passes through the light receiving portion B1, the separate color filter transmits light in part of a wavelength range other than the wavelength range, and particularly transmits light in the entire wavelength range of the infrared light (Ir). The light receiving portions B1 and B2 which have the difference in structure have different spectral sensitivity characteristics, the different spectral sensitivity characteristics are subjected to computation processing in the logic circuit 5 and thus the sensitivity of light in a wavelength range other than the blue included in the light receiving portion B1 is suppressed, with the result that it is possible to extract the blue faithfully.

The light receiving portions G1, G2, R1, R2, B1 and B2 form the RGB light receiving portion in the present invention.

Light receiving portions C1 form the environmental light receiving portion CLEAR shown in FIG. 1. The light receiving portions C1 are arranged in two corners of the light reception region 20 which are the farthest from the center 20c of the light reception region 20. The light receiving portions C1 receive light in all the wavelength range which falls on the light reception region 20. Hence, the light receiving portions C1 are not covered with the infrared light cut filter 2 which is used for the light receiving portions G1, G2, R1, R2, B1 and B2.

Light receiving portions Ir1 form the infrared light receiving portion Ir shown in FIG. 1. The light receiving portions Ir1 are arranged in the two corners where the light receiving portions C1 are not arranged among the four corners which are the farthest from the center 20c of the light reception region 20. The light receiving portions Ir1 detect infrared light which falls on the light reception region 20. Naturally, the light receiving portions Ir1 are not covered with the infrared light cut filter 2.

In the boundaries between the light receiving portions C1 of the environmental light and the RGB light receiving portion and the boundaries between the light receiving portions Ir1 and the RGB light receiving portion (G1, G2, R1, R2, B1 and B2), for example, dummy regions DU in the shape of the letter L are arranged. The dummy regions DU are photosensitive regions, and in the photosensitive regions, for example, bipolar transistors and the like are arranged. The dummy regions DU are provided, and thus a predetermined margin is provided for the arrangement of the infrared light cut filter 2, and light entering the RGB light receiving portion and light entering the other light receiving portion are separated substantially completely.

In FIG. 2, the center 20c of the light reception region 20 is used as a symmetric center, and the light receiving portions G1, G2, R1, R2, B1, B2, C1 and Ir1 are arranged symmetrically with respect to the point. In other words, even when the light receiving portions are rotated by 180 degrees about the axis of the center 20c, the light receiving portions are located in the same positions as the positions before being rotated. In this way, even when light insufficiently enters the light receiving portions on one side, for example, because light is not uniformly applied to the entire light reception region 20, the light receiving portions on the other side can detect the light, with the result that it is possible to enhance the accuracy of detection of light in the optical sensor 10.

Although in FIG. 2, all the light receiving portions of the RGB light receiving portion and the other light receiving portion are arranged symmetrically with respect to the point, at least the light receiving portions G1, G2, R1, R2, B1 and B2 which are the RGB light receiving portion may be arranged symmetrically with respect to the point.

Although the light reception region 20 shown in FIG. 2 is formed in the shape of a quadrangle, even when the light reception region 20 is formed in the shape of, for example, a hexagon, an octagon or a circle, the light receiving portions can be arranged symmetrically with respect to the point.

Figure 3:
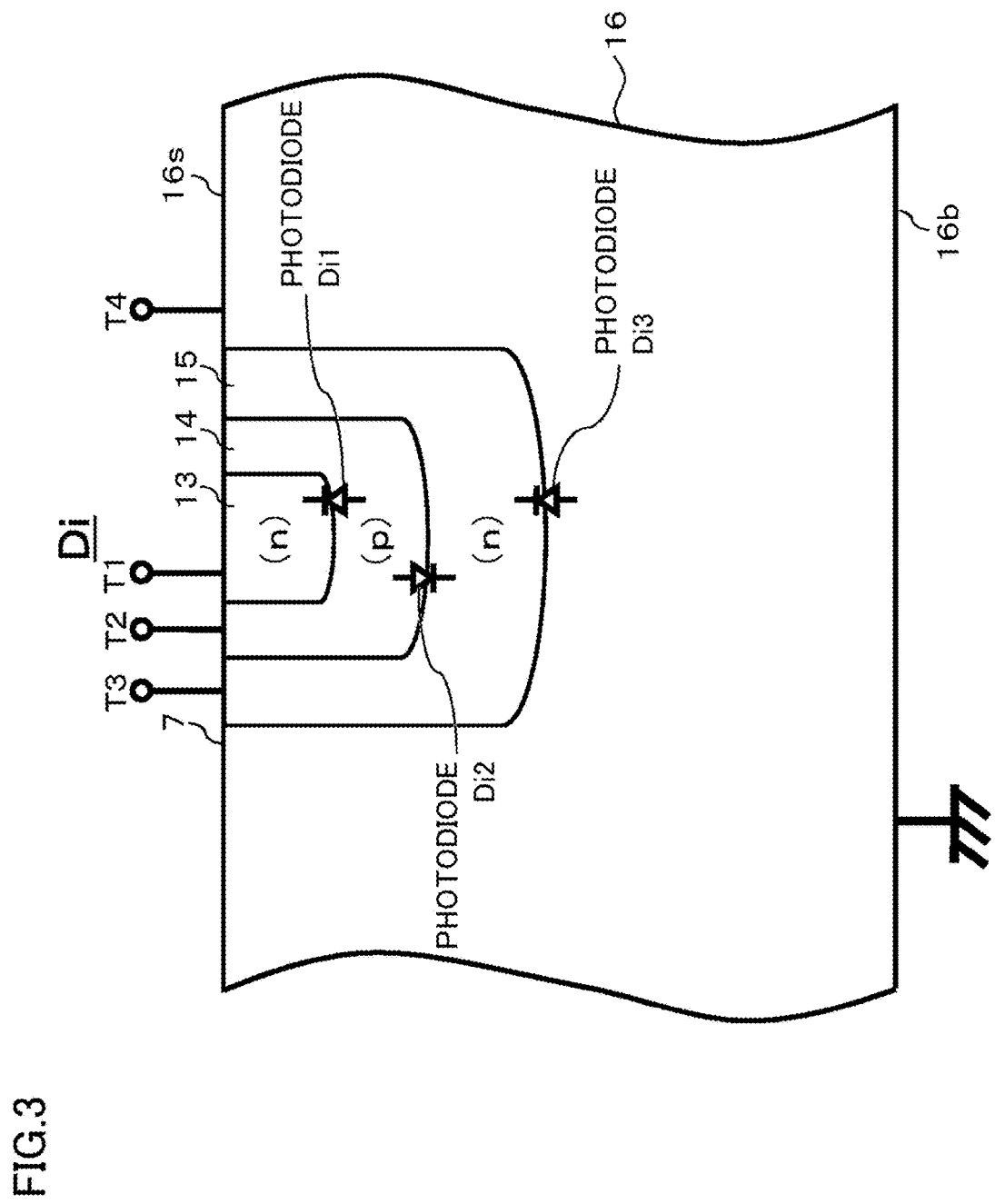
FIG. 3 is a cross-sectional view of photodiodes which are applied to the light reception region shown in FIG. 2.

FIG. 3 schematically shows a cross-sectional view of a photodiode Di which is used in each of the light receiving portions shown in FIG. 2. The photodiode Di has an npnp structure in which a first n-type region 13, a first p-type region 14, a second n-type region 15 and a p-type semiconductor substrate 16 are sequentially formed from the front surface 16s of the p-type semiconductor substrate 16 toward a back surface 16b. The second n-type region 15 is formed within the p-type semiconductor substrate 16, and the first p-type region 14 is formed in the inner region of the second n-type region 15. Furthermore, the first n-type region 13 is formed in the inner region of the first p-type region 14. In this way, the photodiode Di is formed with three photodiodes Di1, Di2 and Di3 from the front surface 16s of the semiconductor substrate 16 toward the back surface 16b.

The photodiode Di1 includes a pn junction portion of the first p-type region 14 and the first n-type region 13, and its depth is, for example, 0.09 to 0.17 μm from the front surface 16s of the semiconductor substrate 16. The photodiode Di2 includes a pn junction portion of the first p-type region 14 and the second n-type region 15, and its depth is deeper than the pn junction portion of the photodiode Di1 and is, for example, 1.0 to 1.8 μm from the front surface 16s of the p-type semiconductor substrate 16. The photodiode Di3 includes a pn junction portion of the p-type semiconductor substrate 16 and the second n-type region 16, and its depth is deeper than the pn junction portion of the photodiode Di2 and is, for example, 3.2 to 5.9 μm from the front surface 16s of the semiconductor substrate 16.

The photodiode Di has the photodiodes Di1 to Di3 of different depths so as to have the following advantages. Specifically, in the p-type semiconductor substrate 16, as the wavelength of light is increased, its penetration depth tends to be increased, and when as in the optical sensor 10, a plurality of wavelength ranges of light components to be detected are present, it is possible to efficiently detect the light in any of the photodiodes Di1 to Di3.

For example, the photodiode Di1 is suitable for detecting components in the wavelength range (for example, 420 to 480 nm) of blue and in the wavelength range (for example, 500 to 560 nm) of green, and the photodiode Di2 is suitable for detecting components in the wavelength range of green and in the wavelength range (for example, 590 to 680 nm) of red. The photodiode Di3 is suitable for detecting components in the wavelength range (for example, 700 to 1300 nm) of infrared light.

In the first n-type region 13, the first p-type region 14, the second n-type region 15 and the p-type semiconductor substrate 16, terminals T1 to T4 are respectively provided in order to electrically extract the photodiodes Di1 to Di3.

Figure 4:
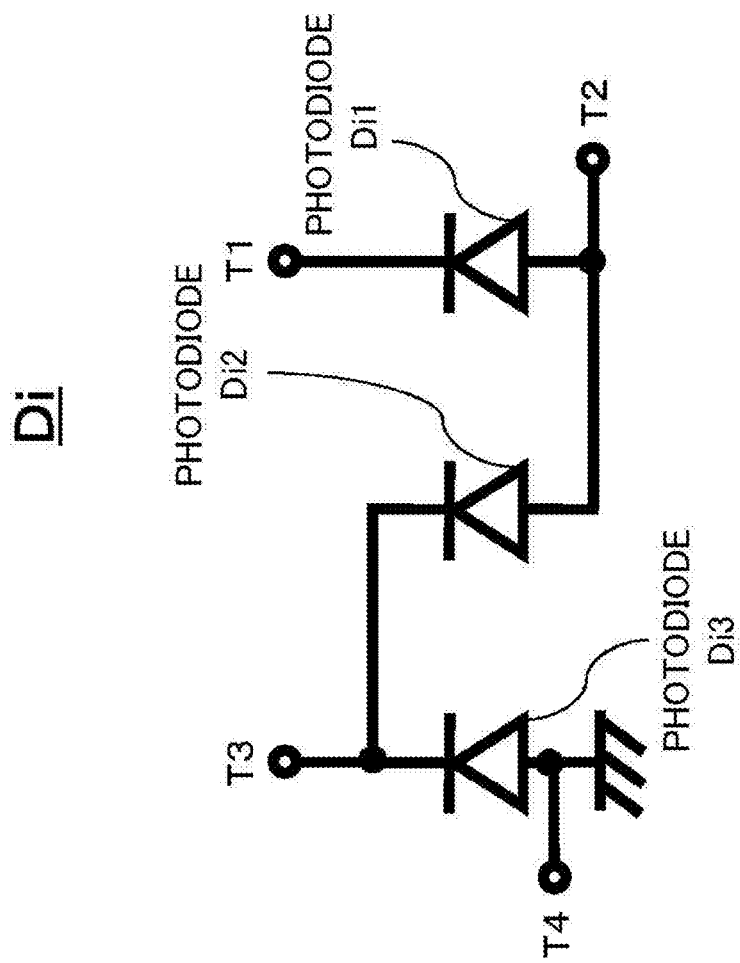
FIG. 4 is an equivalent circuit of FIG. 3.

FIG. 4 is an equivalent circuit of the photodiode Di which has the structure shown in FIG. 3. Terminals T1 to T4 respectively correspond to the terminals T1 to T4 in FIG. 3. The photocurrents generated in the individual light receiving portions are extracted to the outside by the connection of the terminals and coupling with an unillustrated voltage application means or the like.

Figure 5:
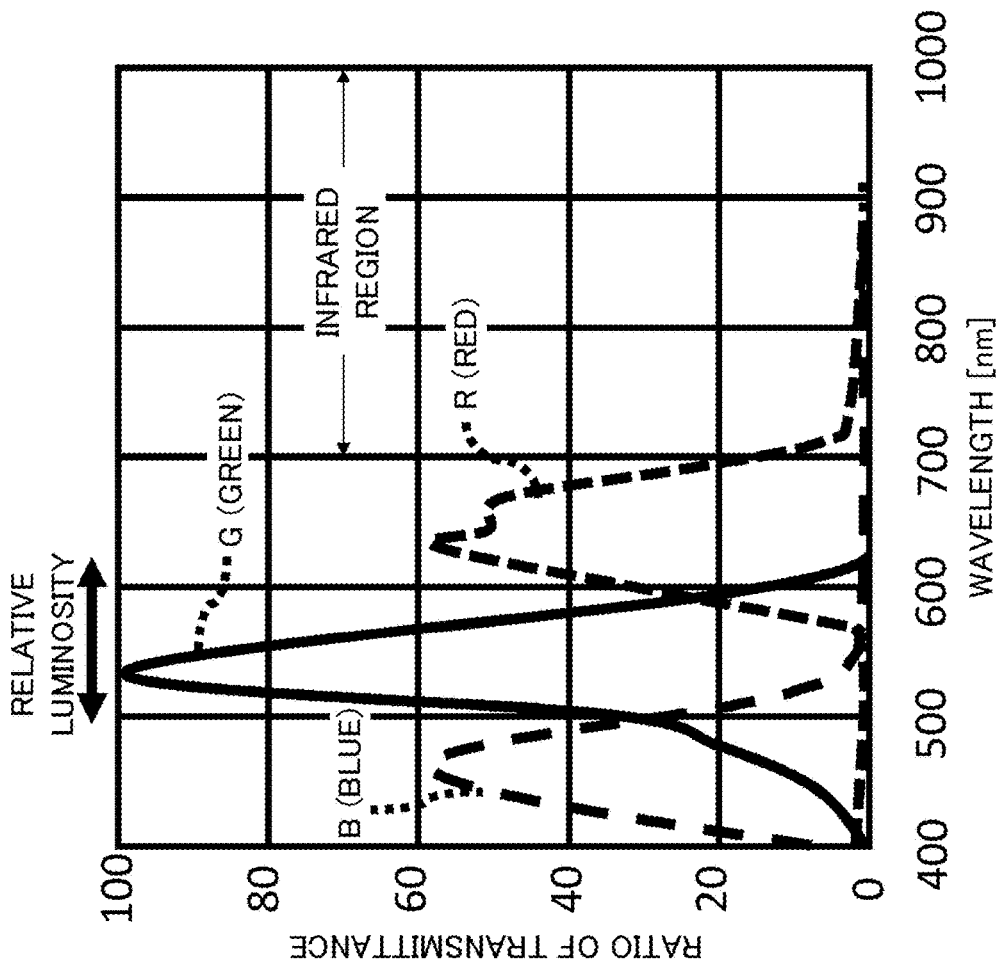
FIG. 5 is a diagram showing a spectral sensitivity characteristic of the light reception region shown in FIG. 2.

FIG. 5 schematically shows spectral sensitivity characteristics when the light reception region 20 shown in FIG. 2 is adopted in the optical sensor 10. The three colors of B (blue), G (green) and R (red) are visible light, and correspond to spectral sensitivity characteristics in the RGB light receiving portion in the present specification. The horizontal axis represents the wavelength of light, and the vertical axis represents the ratio of a transmittance. Here, the transmittance is indicated relatively, and is obtained by plotting the magnitudes of irradiances in individual wavelengths with reference to a wavelength when the irradiance of, for example, G (green) is a peak and with the assumption that the value at that time is 100%. In any event, it is found that when the wavelength is 700 nm or more in an infrared region, the sensitivity of R (red) slightly appears but in G (green) and B (blue), infrared light is suppressed to substantially zero.

Figure 6:
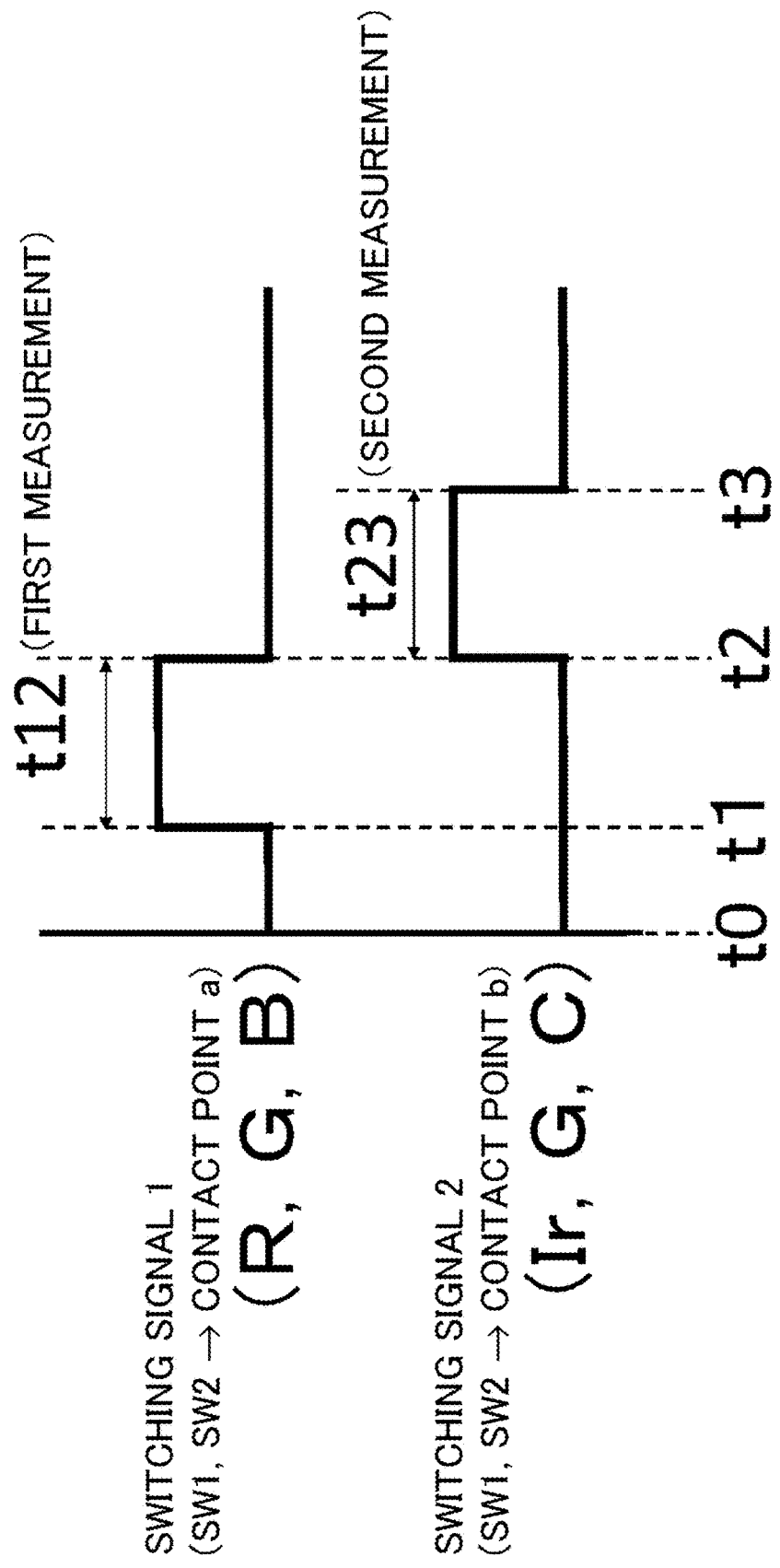
FIG. 6 is a timing chart when the switches in the optical sensor according to the present invention are switched.

FIG. 6 is a timing chart when the switches in the optical sensor 10 according to the present invention are switched. FIG. 6 is a diagram showing steps of switching the switches SW1 and SW2 shown in FIG. 1 when a correction in the optical sensor 10 of the present invention is made. By a switching signal 1, both the midpoints c of the switches SW1 and SW2 are connected to the contact point a. The switching signal 1 is low at a time t0, and is switched from low to high at a time t1. The switching signal 1 is kept high H until a time t2. After the time t2, the switching signal 1 is low L. In a section t12 from the time t1 to the time t2, the photocurrents of the RGB light receiving portion are measured. The section t12 is, for example, 80 ms. The section t12 is referred to as a first step in the present specification.

By a switching signal 2, both the midpoints c of the switches SW1 and SW2 are connected to the contact point b. The switching signal 2 is low L at the time t0 and at the time t1, and is switched from low L to high H at the time t2. The switching signal 2 is kept high H until a time t3. The time width of a section t23 during which the switching signal 2 is kept high H is, for example, 80 ms. In the section t23, the photocurrents of the green G, the infrared light Ir and the environmental light C are measured simultaneously, that is, in real time. The section t23 is referred to as a second step in the present specification.

The photocurrent of the green G is measured twice in the section t12 and in the section t23. However, a time difference of, for example, 80 ms is produced between the measurements. The photocurrents of the other colors are measured once. The red R and the blue B are measured simultaneously with the green G in the section t12 in real time, and the infrared light Ir and the environmental light C are measured in the section t23. In other words, in the section t12, the infrared light Ir and the environmental light C are not targets to be measured, and in the section t23, the photocurrents of the red R and the blue B are removed from the targets to be measured. The time widths of the sections t12 and t23 are preferably short times in terms of real time measurements. However, since a trade-off relationship is present between a measurement time and for example, a measurement time necessary for cancelling light fluctuations in a commercial power supply (frequency 50 Hz/60 Hz), it is impossible to extremely shorten the measurement time. It is found from the findings of the present inventor that as the measurement time, at least a time of about 40 ms is needed. After the time t3, in the section t12 of the infrared light Ir and the environmental light C, for example, the irradiance and the like are estimated and corrected.

FIG. 7 is a diagram showing the operation of switching the switches SW1 and SW2 shown in FIG. 6 and the measurement values and correction values of the photocurrents in the individual light receiving portions in the first and second steps. In FIG. 7, *indicates correction calculation formulas for the photocurrents measured in the infrared light receiving portion Ir and the environmental light receiving portion CLEAR.

In FIG. 7, the five light receiving portions of the infrared light receiving portion Ir, the blue light receiving portion BLUE, the green light receiving portion GREEN, the red light receiving portion RED and the environmental light receiving portion CLEAR are selected as the targets of the photocurrents to be measured.

In FIG. 7, in the first measurement, the infrared light receiving portion Ir is removed from the targets to be measured. The value indicated in the field of the infrared light receiving portion Ir is an estimation value and a correction value calculated after the completion of the second measurement. The blue light receiving portion BLUE is the target to be measured in the first measurement, and for example, an irradiance at that time is indicated as Eb1. The green light receiving portion GREEN is the target to be measured in the first measurement, and for example, an irradiance at that time is indicated as Eg1. The red light receiving portion RED is the target to be measured in the first measurement, and for example, an irradiance at that time is indicated as Er1. In the first measurement, the blue light receiving portion BLUE, the green light receiving portion GREEN and the red light receiving portion RED which are the RGB light receiving portion are the targets to be measured, and the photocurrents in these light receiving portions are measured in real time. As with the infrared light receiving portion Ir, the environmental light receiving portion CLEAR is removed from the targets to be measured in the first measurement. The value indicated in the field of the environmental light receiving portion CLEAR is a correction value calculated after the completion of the second measurement.

In the second measurement, the infrared light receiving portion Ir is the target to be measured. The measurement value of, for example, an irradiance at that time is indicated as Eir2. The blue light receiving portion BLUE is removed from the targets to be measured in the second measurement. Since the green light receiving portion GREEN is set to the computation reference light receiving portion, as in the first measurement, the green light receiving portion GREEN is also the target to be measured in the second measurement. In the second measurement, for example, an irradiance of the green light receiving portion GREEN is indicated as Eg2. The red light receiving portion RED is removed from the targets to be measured in the second measurement. As with the infrared light receiving portion Ir, the environmental light receiving portion CLEAR is the target to be measured in the second measurement, and for example, an irradiance at that time is indicated as Ec2. The irradiance is a physical quantity which indicates radiant energy per area that is applied to an object per time, and the illumination is a value which is corrected for the visibility of human eyes, and though the concepts of both of them are different, it is known to the person skilled in the art that it is possible to convert them into each other. Hence, in the present invention, the irradiance can be replaced with the illumination.

Originally, the five light receiving portions described above are preferably measured simultaneously in the first measurement or in the second measurement, that is, in real time. However, as is clear from what is described above, in the embodiment of the present invention, in the first measurement, for example, the irradiances of the infrared light receiving portion Ir and the environmental light receiving portion CLEAR which are Eir and Ec1 are removed from the targets to be measured. Hence, in the present invention, the green light receiving portion GREEN which is the computation reference light receiving portion is measured twice, and from the ratio thereof, the irradiances Eir and Ec1 in the first measurement are estimated. For example, the irradiance of the infrared light receiving portion Ir in the first measurement, that is, Eir1 is corrected as Eir1=Eir2·(Eg1/Eg2). Likewise, for example, the irradiance of the environmental light receiving portion CLEAR in the first measurement, that is, Ec1 is corrected as Ec1=Ec2·(Eg1/Eg2).

The irradiances of Eir1 and Ec1 are corrected, and thus the irradiances in all the light receiving portions are determined. After the irradiances in all the light receiving portions are corrected and determined, the illuminations, the color temperatures and the like in the individual light receiving portions are calculated in the logic circuit 5 and based on these values, the intensity of light such as backlight in a smart phone, a digital still camera, a navigation system, a tablet terminal or the like in which the optical sensor of the present invention is incorporated is adjusted.

In the method of correcting the optical sensor according to the present invention, as described above, the RGB light receiving portion is measured in real time. Hence, the other light receiving portion except the RGB is corrected with reference to the green light receiving portion which substantially overlays the wavelength range of the relative luminosity that feels most strongly in human eyes, and thus it is possible to reduce the number of ADCs and to enhance the accuracy of detection of photocurrents.

Summarization

Various embodiments disclosed in the present specification will be summarized below.

The optical sensor of the present invention includes a plurality of light receiving portions which include: a RGB light receiving portion formed with a green light receiving portion, a red light receiving portion and a blue light receiving portion; and the other light receiving portion having a spectral sensitivity characteristic different from the spectral sensitivity characteristic of the RGB light receiving portion. The optical sensor of the present invention further includes: a plurality of analog-to-digital converters (ADCs) which convert photocurrents generated in the light receiving portions into digital values; and a switch which is coupled to a signal path between the light receiving portions and the analog-to-digital converters. The switch switches between a first step of applying the photocurrents generated in the RGB light receiving portion to the analog-to-digital converters and a second step of applying the photocurrent generated in a computation reference light receiving portion and the photocurrent generated in the other light receiving portion to the analog-to-digital converters. The switching of the switches described above is performed in order to calculate the value of the photocurrent generated in the other light receiving portion in the first step from a ratio between the photocurrents of the computation reference light receiving portion detected in the first step and the second step.

In the optical sensor according to the present invention, the other light receiving portion is at least one of an environmental light receiving portion and an infrared light receiving portion.

The computation reference light receiving portion is constantly coupled to one of the analog-to-digital converters regardless of the switching between the first step and the second step by the switch. In this way, it is possible to remove a delay in the application of a signal to the ADC and a conversion loss in the ADC caused by the switching of the switch. The switch includes a first switch and a second switch. The first switch selects any one of the blue light receiving portion and the infrared light receiving portion, and the second switch selects any one of at least one light receiving portion other than the blue light receiving portion which is included in the RGB light receiving portion and the environmental light receiving portion.

The optical sensor according to the present invention is formed in a semiconductor substrate. The RGB light receiving portion and the other light receiving portion are formed by utilization of a first pn junction, a second pn junction and a third pn junction which are sequentially formed from the front surface of the semiconductor substrate toward the direction of the thickness, that is, the back surface of the semiconductor substrate. The blue light receiving portion is formed by utilization of, for example, the first pn junction, the green light receiving portion is formed by utilization of, for example, the first pn junction or the second pn junction, the red light receiving portion and the environmental light receiving portion are formed by utilization of, for example, the second pn junction and the infrared light receiving portion is formed by utilization of, for example, the third pn junction. The reason why the junctions are used appropriately as described above is that as the wavelength of light is increased, its penetration depth tends to be increased. In general, as the light receiving portion of blue whose wavelength is relatively short, the first pn junction formed in the side of the front surface of the semiconductor substrate is preferably utilized, and as the light receiving portion of infrared light whose wavelength is relatively long, the third pn junction formed away from the front surface of the semiconductor substrate in the direction of the thickness is preferably utilized. As the light receiving portions of green and red whose wavelengths are present between blue and infrared light, the second pn junction is preferably utilized. The environmental light receiving portion is formed by utilization of, for example, the second pn junction.

The optical sensor according to the present invention is formed in the semiconductor substrate. A light reception region is formed with an aggregation of the RGB light receiving portion and the other light receiving portion, the center of the light reception region is used as a symmetric point and the green light receiving portion, the red light receiving portion and the blue light receiving portion forming the RGB light receiving portion and the environmental light receiving portion and the infrared light receiving portion forming the other light receiving portion are arranged symmetrically with respect to the point in plan view. Preferably, the green light receiving portion and the red light receiving portion are arranged symmetrically with respect to the point so as to be closest to the center of the light reception region.

A method of correcting an optical sensor which is a separate invention of the present invention is applied to the optical sensor described above. In a first step, the irradiance of a computation reference light receiving portion is measured, and based on the result of the measurement, an illumination, a color temperature and the like are calculated. Although in the first step, the irradiance of the other light receiving portion is removed from the targets to be measured, in a second step, the irradiance of the other light receiving portion is the target to be measured, and the irradiance is measured. The value of the irradiance of the other light receiving portion in the first step is estimated, and an estimation value and a correction value are estimated and corrected based on the irradiances of the computation reference light receiving portion measured in the first and second steps. Based on the estimated and corrected irradiance, the illumination, the color temperature and the like of the other light receiving portion are calculated.

In the configuration described above, in the RGB light receiving portion, the irradiance, the illumination, the color temperature and the like are measured and calculated in real time, and the environmental light receiving portion or the infrared light receiving portion which is the other light receiving portion is measured in a separate step but based on the irradiance of the computation reference light receiving portion measured previously, the illumination, the color temperature and the like can be calculated and corrected. In this way, it is possible to reduce the number of ADCs, to enhance the accuracy of the measurement of the spectral sensitivity characteristics of the optical sensor and to reduce the size and thereby reduce the cost and the power consumption.

INDUSTRIAL APPLICABILITY

Since in the optical sensor of the present invention, it is possible to reduce the size of a semiconductor integration circuit (LSI), to reduce the cost and to reduce the power consumption, the industrial applicability thereof is enhanced.

What is claimed is:

1. An optical sensor comprising:
a plurality of light receiving portions which include: a RGB light receiving portion formed with a green light receiving portion, a red light receiving portion and a blue light receiving portion; and an other light receiving portion having a spectral sensitivity characteristic different from a spectral sensitivity characteristic of the RGB light receiving portion;
a plurality of analog-to-digital converters which convert photocurrents generated in the light receiving portions into digital values; and
a switch which is coupled to a signal path between the light receiving portions and the analog-to-digital converters,
wherein the switch switches between a first step of applying the photocurrents generated in the RGB light receiving portion to the analog-to-digital converters and a second step of applying the photocurrent generated in at least one computation reference light receiving portion selected from the RGB light receiving portion and the photocurrent generated in the other light receiving portion to the analog-to-digital converters, and
the optical sensor calculates the photocurrent generated in the other light receiving portion in the first step from a ratio between the photocurrents of the computation reference light receiving portion selected both in the first step and the second step.

2. The optical sensor according to claim 1,
wherein the other light receiving portion is at least one of an environmental light receiving portion and an infrared light receiving portion.

3. The optical sensor according to claim 2,
wherein the computation reference light receiving portion is a light receiving portion that has a sensitivity in a wavelength range in which a relative luminosity is a peak.

4. The optical sensor according to claim 1,
wherein the computation reference light receiving portion is the green light receiving portion.

5. The optical sensor according to claim 1,
wherein the computation reference light receiving portion is the red light receiving portion.

6. The optical sensor according to claim 1,
wherein the computation reference light receiving portion is at least one of the blue light receiving portion and the other light receiving portion.

7. The optical sensor according to claim 1,
wherein the computation reference light receiving portion is constantly coupled to one of the analog-to-digital converters regardless of the switching between the first step and the second step by the switch.

8. The optical sensor according to claim 1,
wherein the RGB light receiving portion is covered with an infrared light cut filter, and the other light receiving portion is not covered with the infrared light cut filter.

9. The optical sensor according to claim 8,
wherein the switch includes a first switch and a second switch,
the first switch selects any one of the blue light receiving portion and an infrared light receiving portion which forms the other light receiving portion and
the second switch selects any one of one light receiving portion other than the blue light receiving portion which is included in the RGB light receiving portion and an environmental light receiving portion which forms the other light receiving portion.

10. The optical sensor according to claim 1,
wherein the RGB light receiving portion and the other light receiving portion are formed by utilization of a first pn junction, a second pn junction and a third pn junction which are sequentially formed from a front surface of a semiconductor substrate toward a back surface, and
the blue light receiving portion is formed by utilization of the first pn junction, the green light receiving portion is formed by utilization of the first pn junction or the second pn junction, the red light receiving portion and an environmental light receiving portion are formed by utilization of the second pn junction and an infrared light receiving portion is formed by utilization of the third pn junction.

11. The optical sensor according to claim 10,
wherein a light reception region is formed on the semiconductor substrate with an aggregation of the RGB light receiving portion and the other light receiving portion,
a center of the light reception region is used as a symmetric point and
the green light receiving portion, the red light receiving portion and the blue light receiving portion forming the RGB light receiving portion and the environmental light receiving portion and the infrared light receiving portion forming the other light receiving portion are arranged symmetrically with respect to the point in plan view.

12. The optical sensor according to claim 11,
wherein the center of the light reception region is used as the symmetric point, and
the green light receiving portion and the red light receiving portion are arranged symmetrically with respect to the point so as to be closest to the center.

13. The optical sensor according to claim 11,
wherein the light reception region is formed in a shape of a quadrangle in plan view, and
in four corners of the quadrangle, the environmental light receiving portion and the infrared light receiving portion are arranged symmetrically with respect to the point with the center used as the symmetric point.

14. The optical sensor according to claim 13,
wherein a dummy region is provided between the environmental light receiving portion and the RGB light receiving portion and between the infrared light receiving portion and the RGB light receiving portion.

15. A method of correcting the optical sensor of claim 1,
wherein in the first step, the photocurrent of the computation reference light receiving portion is measured but the photocurrent of the other light receiving portion is not measured, and
in the second step, the photocurrent of the computation reference light receiving portion measured in the first step and the photocurrent of the other light receiving portion are measured, and based on the photocurrents of the computation reference light receiving portion measured in the first step and the second step, the photocurrent of the other light receiving portion in the first step is estimated and corrected.

16. The correcting method according to claim 14,
wherein the computation reference light receiving portion is the green light receiving portion, and the other light receiving portion is at least one of an environmental light receiving portion and an infrared light receiving portion.

17. The correcting method according to claim 15,
wherein the photocurrent is at least one of an irradiance, an illumination, a color temperature and a chromaticity.

18. An optical sensor comprising:
a first light receiving portion;
a second light receiving portion;
a computation reference light receiving portion;
a plurality of analog-to-digital converters; and
a switch which switches between a first step of applying individual output signals of the first light receiving portion and the computation reference light receiving portion to the analog-to-digital converters and a second step of applying individual output signals of the second light receiving portion and the computation reference light receiving portion to the analog-to-digital converters,
wherein an output signal of the second light receiving portion in the first step is calculated from the output signal of the second light receiving portion in the second step and a ratio of the output signals of the computation reference light receiving portion in both the first and second steps.

* * * * *